US009232673B2

(12) United States Patent
Nishisaka et al.

(10) Patent No.: US 9,232,673 B2
(45) Date of Patent: *Jan. 5, 2016

(54) CERAMIC ELECTRONIC COMPONENT INCLUDING COATING LAYER

(71) Applicant: Murata Manufacturing Co., Ltd., Nagaokakyo-shi, Kyoto-fu (JP)

(72) Inventors: Yasuhiro Nishisaka, Nagaokakyo (JP); Yukio Sanada, Nagaokakyo (JP); Tetsuya Kisumi, Nagaokakyo (JP); Toshiki Nagamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 122 days.

This patent is subject to a terminal disclaimer.

(21) Appl. No.: 13/755,197

(22) Filed: Jan. 31, 2013

(65) Prior Publication Data
US 2013/0200749 A1    Aug. 8, 2013

(30) Foreign Application Priority Data

Feb. 3, 2012 (JP) ................................. 2012-022320
Dec. 27, 2012 (JP) ................................. 2012-284453

(51) Int. Cl.
*H01G 4/005* (2006.01)
*H01G 4/30* (2006.01)
(Continued)

(52) U.S. Cl.
CPC .................. *H05K 7/00* (2013.01); *H01C 1/148* (2013.01); *H01C 7/008* (2013.01); *H01C 7/18* (2013.01);
(Continued)

(58) Field of Classification Search
CPC ....... H01G 4/2325; H01G 4/232; H01G 4/30; H01G 41/0472

USPC .......................................... 361/306.3, 321.2
See application file for complete search history.

(56) References Cited

U.S. PATENT DOCUMENTS 5,818,686 A    10/1998  Mizuno et al.
6,958,899 B2 * 10/2005  Togashi et al. ................ 361/303
(Continued)

FOREIGN PATENT DOCUMENTS

JP    04023308 A  *  1/1992
JP    08-097075 A     4/1996
(Continued)

OTHER PUBLICATIONS

Nishisaka et al, "Ceramic Electronic Component", U.S. Appl. No. 13/755,224, filed Jan. 31, 2013.
(Continued)

*Primary Examiner* — David M Sinclair
(74) *Attorney, Agent, or Firm* — Keating & Bennett, LLP

(57) ABSTRACT

A ceramic electronic component includes a ceramic body; a plurality of internal electrodes provided in the ceramic body and including ends exposed on a surface of the ceramic body; a coating layer covering a surface portion of the ceramic body on which the internal electrodes are exposed, the coating layer being made of a glass or resin medium in which metal powder particles are dispersed; and an electrode terminal provided directly on the coating layer and including a plating film. The metal powder particles define conduction paths electrically connecting the internal electrodes with the electrode terminal and have an elongated shape in cross section along a thickness direction of the coating layer. The metal powder particles defining the conduction paths have a maximum diameter not smaller than the thickness of the coating layer.

19 Claims, 11 Drawing Sheets

(51) Int. Cl.

| | |
|---|---|
| *H01G 4/232* | (2006.01) |
| *H05K 7/00* | (2006.01) |
| *H02N 2/00* | (2006.01) |
| *H01C 7/00* | (2006.01) |
| *H01C 1/148* | (2006.01) |
| *H01C 7/18* | (2006.01) |
| *H01F 17/00* | (2006.01) |
| *H01L 41/047* | (2006.01) |
| *H01F 27/29* | (2006.01) |

(52) U.S. Cl.
CPC ............ *H01G 4/005* (2013.01); *H01G 4/2325* (2013.01); *H01G 4/30* (2013.01); *H02N 2/00* (2013.01); *H01F 17/0006* (2013.01); *H01F 27/292* (2013.01); *H01L 41/0472* (2013.01)

(56) References Cited

U.S. PATENT DOCUMENTS

| | | | |
|---|---|---|---|
| 7,285,232 B2 * | 10/2007 | Miki | 252/514 |
| 7,510,673 B2 * | 3/2009 | Ohtani et al. | 252/512 |
| 8,179,660 B2 * | 5/2012 | Katsube et al. | 361/306.1 |
| 2003/0231457 A1 | 12/2003 | Ritter et al. | |
| 2004/0022009 A1 | 2/2004 | Galvagni et al. | |
| 2004/0090732 A1 | 5/2004 | Ritter et al. | |
| 2004/0197973 A1 | 10/2004 | Ritter et al. | |
| 2004/0218344 A1 | 11/2004 | Ritter et al. | |
| 2004/0218373 A1 | 11/2004 | Ritter et al. | |
| 2004/0257748 A1 | 12/2004 | Ritter et al. | |
| 2004/0264105 A1 | 12/2004 | Galvagni et al. | |
| 2005/0046536 A1 | 3/2005 | Ritter et al. | |
| 2005/0083637 A1 * | 4/2005 | Yoshll et al. | 361/600 |
| 2005/0146837 A1 | 7/2005 | Ritter et al. | |
| 2006/0137488 A1 * | 6/2006 | Sakaue et al. | 75/255 |
| 2007/0014075 A1 | 1/2007 | Ritter et al. | |
| 2007/0133147 A1 | 6/2007 | Ritter et al. | |
| 2011/0290542 A1 * | 12/2011 | Nishisaka et al. | 174/257 |
| 2012/0007709 A1 * | 1/2012 | Taniguchi et al. | 336/200 |

FOREIGN PATENT DOCUMENTS

| | | | |
|---|---|---|---|
| JP | 09007879 A * | 1/1997 | |
| JP | 09-102854 A | 4/1997 | |
| JP | 10-050550 A | 2/1998 | |
| JP | 11243029 A * | 9/1999 | |
| JP | 2001-338830 A | 12/2001 | |
| JP | 2002134351 A * | 5/2002 | |
| JP | 2002-203737 A | 7/2002 | |
| JP | 2004-327983 A | 11/2004 | |
| JP | 2005-228610 A | 8/2005 | |
| JP | 2005209415 A * | 8/2005 | |
| JP | 2008-198655 A | 8/2008 | |
| JP | 2011-49351 A | 3/2011 | |
| JP | 2011138704 A * | 7/2011 | |
| JP | 2012033621 A * | 2/2012 | |
| KR | 10-2005-0102767 A | 10/2005 | |
| WO | 2004/093137 A2 | 10/2004 | |

OTHER PUBLICATIONS

Nishisaka et al, "Ceramic Electronic Component and Method for Producing the Same", U.S. Appl. No. 13/755,232, filed Jan. 31, 2013.

* cited by examiner

CERAMIC ELECTRONIC COMPONENT INCLUDING COATING LAYER

BACKGROUND OF THE INVENTION

1. Field of the Invention

The present invention relates to ceramic electronic components.

2. Description of the Related Art

Ceramic electronic components, typified by ceramic capacitors, are widely used in electronic devices, such as a cellular phone or a portable audio player. A ceramic electronic component generally includes a ceramic body; internal electrodes whose ends are exposed on the surface of the ceramic body; and external electrodes disposed to cover the surface regions of the ceramic body on which the internal electrodes are exposed. Examples of the external electrode include one obtained by applying and baking an electrically conductive paste to the ceramic body to form a sintered metal film and then plating the sintered metal film, as described in JP-A-2002-203737, and one formed only of a plating film, as described in JP-A-2004-327983.

However, because the electrically conductive paste used in forming the sintered metal film has high viscosity, the thickness of the resultant sintered metal film becomes large. For example, JP-A-2002-203737 states that the thickness of first and second electrode layers (sintered metal films) reaches approximately 50 μm to 90 μm.

Furthermore, if the external electrode is formed of a sintered metal film, the baking temperature at which the electrically conductive paste is baked reaches a high temperature. Therefore, a ceramic component in the ceramic body and a glass component in the electrically conductive paste may diffuse into each other to form a reaction layer at the interface between the ceramic body and the sintered metal film. In this case, a plating solution may enter the ceramic body through the site where the reaction layer is formed, which may cause a problem of a decrease in mechanical strength of the ceramic body and a problem of deterioration in reliability of moisture resistance thereof. In addition, the high baking temperature causes the precipitation of the glass component on the surface of the sintered metal film, i.e., glass floating, which presents another problem of difficulty in forming a plating film on the surface of the sintered metal film.

To cope with this, a method of making an external electrode only of a plating film is proposed as in JP-A-2004-327983. When an external electrode is made only of a plating film, the external electrode can be formed thinner than that formed by baking an electrically conductive paste, for example.

In addition, because the plating solution contains no glass component, no reaction layer is formed at the interface between the ceramic body and the plating film. Therefore, problems of a decrease in mechanical strength and deterioration in reliability of moisture resistance due to the formation of the reaction layer are less likely to occur. No glass floating occurs, so that the problem of difficulty in forming a plating film can be eliminated.

However, in order to form the external electrode only of a plating film, it is necessary to immerse the ceramic body directly into a plating solution. This presents a problem of the plating solution entering into the ceramic body through exposed portions of the internal electrodes. Thus, the resultant ceramic electronic component may have decreased moisture resistance.

Furthermore, when the external electrode is formed only of a plating film, the plating film is not chemically but only physically bound to the ceramic body, so that the adhesion between the plating film and the ceramic body will be poor. As a result, when the ceramic electronic component is in use, moisture or the like is likely to enter the ceramic body from between the plating film and the ceramic body. Also in this view, the resultant ceramic electronic component may have decreased moisture resistance.

SUMMARY OF THE INVENTION

Preferred embodiments of the present invention provide a ceramic electronic component having superior moisture resistance while maintaining a small thickness of the external electrode.

A ceramic electronic component according to a preferred embodiment of the present invention includes a ceramic body, a plurality of internal electrodes, a coating layer, and an electrode terminal. The plurality of internal electrodes are provided in the ceramic body. The plurality of internal electrodes include ends exposed on a surface of the ceramic body. The coating layer covers a portion of the surface of the ceramic body on which the plurality of internal electrodes are exposed. The coating layer preferably is made of a glass medium or a resin medium in which metal powder particles are dispersed. The electrode terminal is provided directly on the coating layer. The electrode terminal preferably includes a plating film. The metal powder particles define conduction paths electrically connecting the plurality of internal electrodes with the electrode terminal. The metal powder particles have an elongated shape as viewed in cross section along a thickness direction of the coating layer. The metal powder particles defining the conduction paths have a maximum diameter equal to or larger than the thickness of the coating layer.

In a particular aspect of the ceramic electronic component according to a preferred embodiment of the present invention, the metal powder particles are preferably in flake form.

In another particular aspect of the ceramic electronic component according to a preferred embodiment of the present invention, the maximum diameter of the metal powder particles preferably is about 1.5 or more times the thickness of the coating layer.

In still another particular aspect of the ceramic electronic component according to a preferred embodiment of the present invention, the metal powder particles preferably have an aspect ratio of about 3.6 or more.

In still another particular aspect of the ceramic electronic component according to a preferred embodiment of the present invention, at least one of the conduction paths is preferably arranged so that a plurality of the metal powder particles are contiguous with one another across the thickness of the coating layer.

In still another particular aspect of the ceramic electronic component according to a preferred embodiment of the present invention, the metal powder particles preferably contain a major component different from a metal contained as a major component in the internal electrodes.

In still another particular aspect of the ceramic electronic component according to a preferred embodiment of the present invention, the metal powder particles preferably have a core made of Cu.

In still another particular aspect of the ceramic electronic component according to a preferred embodiment of the present invention, the coating layer preferably has a thickness of about 1 μm to about 10 μm.

In still another particular aspect of the ceramic electronic component according to a preferred embodiment of the present invention, at least one of the conduction paths preferably is non-linear as viewed in cross section along the thickness direction of the coating layer.

In still another particular aspect of the ceramic electronic component according to a preferred embodiment of the present invention, at least one of the conduction paths preferably includes a plurality of relatively narrow portions and a plurality of relatively thick portions.

In still another particular aspect of the ceramic electronic component according to a preferred embodiment of the present invention, a portion of the plating film in contact with the coating layer preferably is defined by a Cu plating film or a Ni plating film.

In still another particular aspect of the ceramic electronic component according to a preferred embodiment of the present invention, the amount of glass or resin in the coating layer preferably is about 35% by volume or more.

In various preferred embodiments of the present invention, a ceramic electronic component can be provided which has superior moisture resistance while maintaining a small thickness of the electrode terminal. In addition, in producing the ceramic electronic component, the plating film can be coated in a short period of time even at a small current to increase the efficiency of the plating process and the growth of the plating film in the thickness direction can be suppressed to achieve size reduction of the ceramic electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
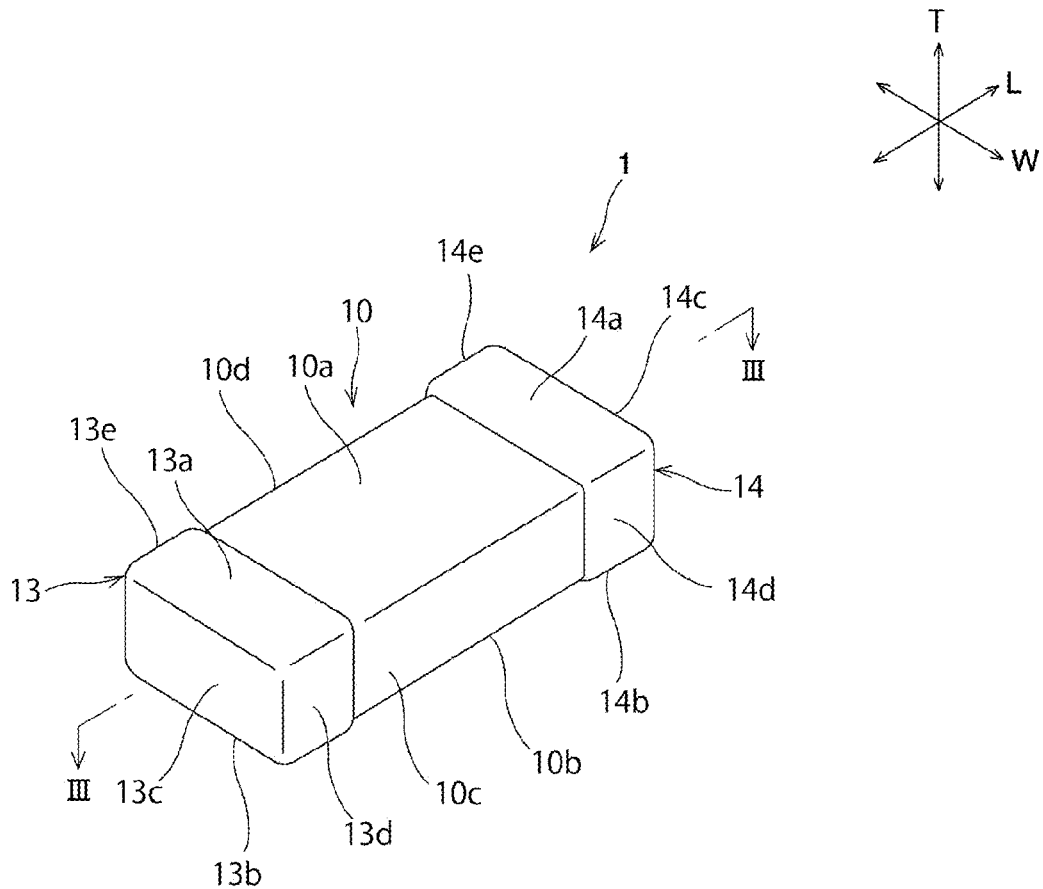
FIG. 1 is a schematic perspective view of a ceramic electronic component according to a first preferred embodiment of the present invention.

Hereinafter, preferred embodiments of the present invention will be described. However, the following preferred embodiments are merely illustrative. The present invention is not intended to be limited to the following preferred embodiments.

Throughout the drawings to which the preferred embodiments and the like refer, elements having substantially the same functions will be referred to by the same reference signs. The drawings to which the preferred embodiments and the like refer are schematically illustrated and, therefore, the dimensional ratios and the like of elements illustrated in the drawings may be different from those of the actual elements. Different drawings may have different dimensional ratios and the like of the elements. Dimensional ratios and the like of specific objects should be determined in consideration of the following descriptions.

Figure 2:
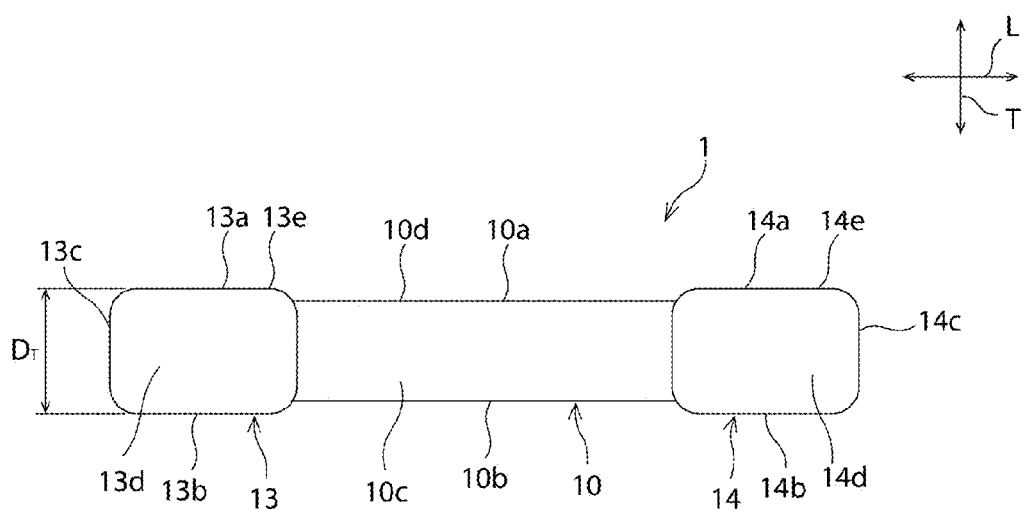
FIG. 2 is a schematic side view of the ceramic electronic component according to the first preferred embodiment of the present invention.
Figure 3:
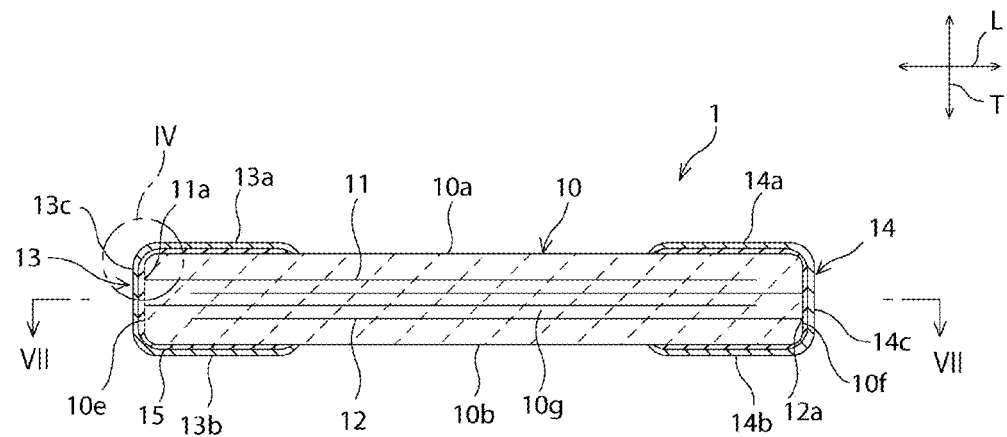
FIG. 3 is a schematic cross-sectional view taken along the line III-III in FIG. 1.
Figure 4:
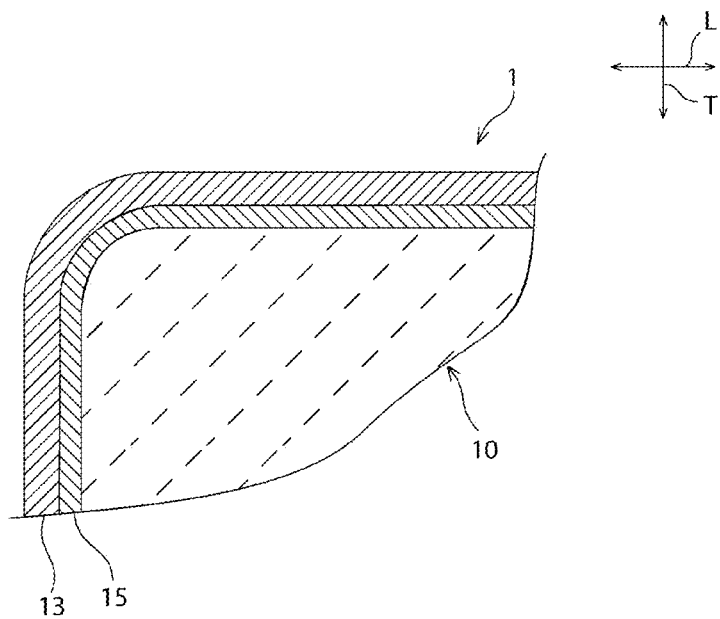
FIG. 4 is a schematic enlarged cross-sectional view of a portion enclosed by the line IV in FIG. 3.
Figure 5:
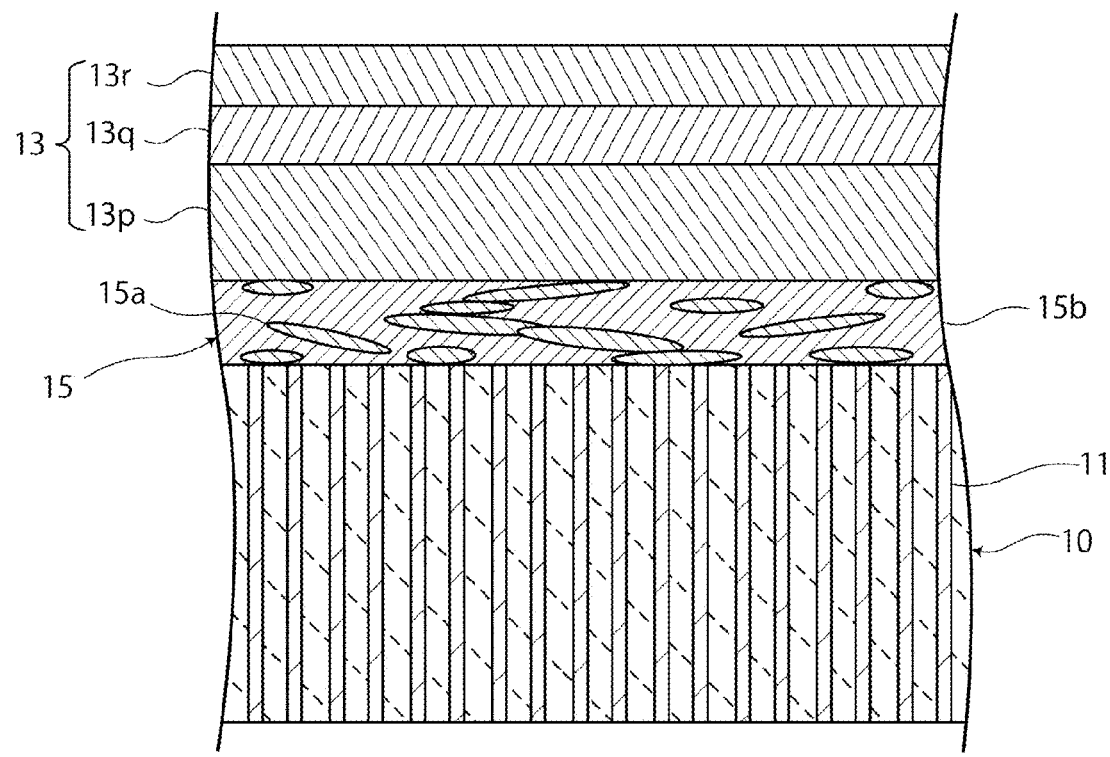
FIG. 5 is a schematic cross-sectional view of a glass coating layer and a first electrode terminal of the ceramic electronic component produced in the first preferred embodiment of the present invention.
Figure 6:
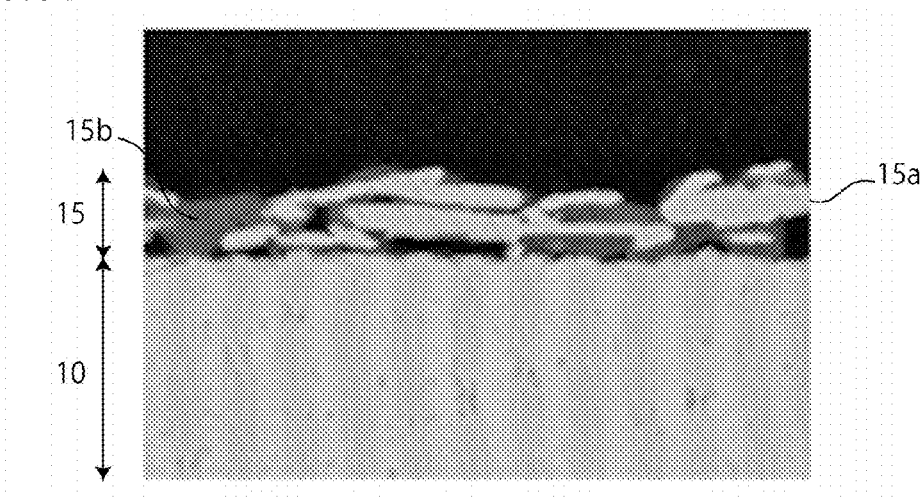
FIG. 6 is a scanning electron microscopic photograph of a cross section of the glass coating layer in an end surface of the ceramic electronic component produced in the first preferred embodiment of the present invention.
Figure 7:
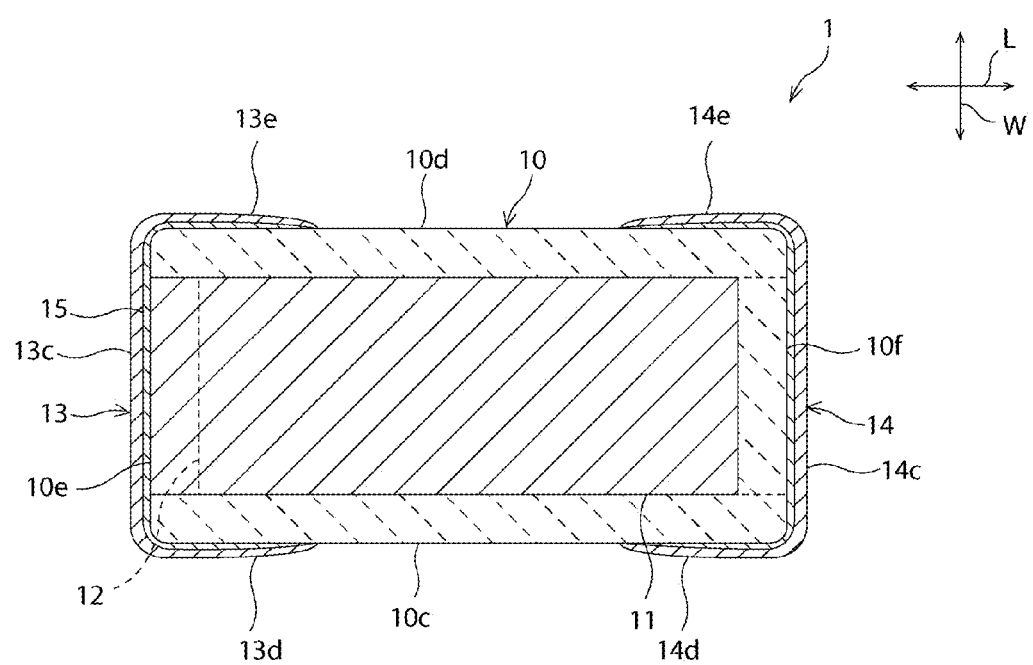
FIG. 7 is a schematic cross-sectional view taken along the line VII-VII in FIG. 3.

FIG. 1 is a schematic perspective view of a ceramic electronic component according to the first preferred embodiment of the present invention. FIG. 2 is a schematic side view of the ceramic electronic component according to this preferred embodiment. FIG. 3 is a schematic cross-sectional view taken along the line III-III in FIG. 1. FIG. 4 is a schematic enlarged cross-sectional view of a portion enclosed by the line IV in FIG. 3. FIG. 5 is a schematic cross-sectional view of a glass coating layer and a first electrode terminal of the ceramic electronic component produced in this preferred embodiment. FIG. 6 is a scanning electron microscopic (SEM) photograph of a cross section of the interface between the coating layer and a first electrode terminal of the ceramic electronic component produced in this preferred embodiment. Note that FIG. 6 is a photograph when only the glass coating layer is formed in order to facilitate understanding of the state of the glass coating layer. FIG. 7 is a schematic cross-sectional view taken along the line VII-VII in FIG. 3.

First, a description is given of the structure of the ceramic electronic component 1 with reference to FIGS. 1 to 7.

As shown in FIGS. 1 to 3 and 7, the ceramic electronic component 1 includes a ceramic body 10. The ceramic body 10 is made of an appropriate ceramic material according to the function of the ceramic electronic component 1. Specifically, if the ceramic electronic component 1 is a capacitor, the ceramic body 10 can be made of a dielectric ceramic material. Specific non-limiting examples of the dielectric ceramic material include $BaTiO_3$, $CaTiO_3$, $SrTiO_3$, and $CaZrO_3$. If the ceramic body 10 contains a dielectric ceramic material, in addition to the above ceramic material as a major component, an accessory component or components, such as a Mn compound, a Mg compound, a Si compound, a Fe compound, a Cr compound, a Co compound, a Ni compound, or a rare earth compound, may be appropriately added to the ceramic body 10 depending upon desired properties of the resultant ceramic electronic component 1.

No particular limitation is placed on the shape of the ceramic body 10. In this preferred embodiment, the ceramic body 10 preferably has a rectangular box shape, for example. As shown in FIGS. 1 to 3, the ceramic body 10 includes first and second principal surfaces 10a and 10b extending along the length direction L and the width direction W. The ceramic body 10 also includes, as shown in FIGS. 1, 2, and, 7, first and second side surfaces 10c and 10d extending along the thickness direction T and the length direction L. In addition, as shown in FIGS. 2, 3, and, 7, the ceramic body 10 also includes first and second end surfaces 10e and 10f extending along the thickness direction T and the width direction W.

The term "rectangular box shape" used herein includes any rectangular box shape having rounded corners and ridges. In other words, the "rectangular box-shaped" member includes every member having the first and second principal surfaces, the first and second side surfaces, and the first and second end surfaces. Furthermore, all or some of the principal surfaces, side surfaces, and end surfaces may have asperities.

No particular limitation is placed on the dimensions of the ceramic body 10. However, where the thickness of the ceramic body 10 is represented by $D_T$, the length thereof is represented by $D_L$, and the width thereof is represented by $D_W$, the ceramic body 10 may have a thin shape satisfying that $D_T<D_W<D_L$, $(1/5)D_W \leq D_T \leq (1/2)D_W$ or $D_T<0.3$ mm, for example. Specifically, the ceramic body 10 may satisfy that $0.05$ mm$\leq D_T<0.3$ mm, $0.4$ mm$\leq D_L \leq 1$ mm, and $0.3$ mm$\leq D_W \leq 0.5$ mm, for example.

As shown in FIGS. 3 and 7, the interior of the ceramic body 10 includes a plurality of approximately rectangular first internal electrodes 11 and a plurality of approximately rectangular second internal electrodes 12. The first and second internal electrodes 11 and 12 are alternately arranged at regular intervals in the thickness direction T. The first and second internal electrodes 11 and 12 are exposed at first ends 11a and 12a on the surface of the ceramic body 10. Specifically, the first internal electrodes 11 are exposed at the first ends 11a on the first end surface 10e of the ceramic body 10. The second internal electrodes 12 are exposed at second ends 12a on the second end surface 10f of the ceramic body 10.

The first and second internal electrodes 11 and 12 are parallel or approximately parallel with the first and second principal surfaces 10a and 10b. Each pair of adjacent first and second internal electrodes 11 and 12 face each other in the thickness direction T with a ceramic layer 10g interposed therebetween.

No particular limitation is placed on the thickness of the ceramic layer 10g. The thickness of the ceramic layer 10g may be about 0.5 μm to about 10 μm, for example. No particular limitation is also placed on the thickness of each of the first and second internal electrodes 11 and 12. The thickness of each of the first and second internal electrodes 11 and 12 may be about 0.2 μm to about 2 μm, for example.

The first and second internal electrodes 11 and 12 can be made of any appropriate electrically conductive material. For example, the first and second internal electrodes 11 and 12 can be made of a metal, such as Ni, Cu, Ag, Pd or Au, or an alloy containing one or more of these metals, such as Ag—Pd alloy.

As shown in FIG. 4, coating layers 15 are provided on the surface of the ceramic body 10. The coating layers 15 cover portions of the surface of the ceramic body 10 on which the first and second internal electrodes 11 and 12 are exposed. Specifically, the coating layers 15 are provided on the first and second end surfaces 10e and 10f of the ceramic body 10, both ends of each of the first and second principal surfaces 10a and 10b in the length direction L, and both ends of each of the first and second side surfaces 10c and 10d in the length direction L.

As shown in FIGS. 5 and 6, the coating layer 15 preferably includes a medium 15b made of a glass or resin in which metal powder particles 15a are dispersed. The coating layer 15 is a composite film in which the medium 15b and the metal powder particles 15a are integrally bonded. For example, the medium 15b may be obtained by thermally treating glass powder at a softening point or higher temperature to melt it and then solidifying the molten glass into a single piece. Thus, the medium 15b exists to fill the spaces between the metal powder particles 15a. The medium 15b covers the surface portions of the ceramic body 10. This medium 15b improves the moisture resistance of the ceramic electronic component 1. Note that FIGS. 5 and 6 are views in certain cross sections and the other cross sections show different views of the glass medium 15b and metal powder particles 15a.

In the coating layers 15, the volume content of the medium 15b may be smaller than that of the metal powder particles 15a. The amount of the medium 15b in the coating layer 15 is preferably about 35% by volume or more, more preferably about 35% to about 75% by volume, and still more preferably about 40% to about 57.5% by volume, for example. If the amount of the medium 15b in the coating layer 15 is less than about 35% by volume, this may reduce the effect of improving the moisture resistance of the ceramic electronic component 1 owing to the existence of the coating layer 15. On the contrary, if the amount of the medium 15b in the coating layer 1 is more than about 75% by volume, this may make it difficult to form first and second electrode terminals 13 and 14 directly on the associated coating layers 15.

The glass forming the medium 15b preferably contains, for example, one or more network formers selected from the group consisting of $B_2O_3$ and $SiO_2$ and one or more network modifiers selected from the group consisting of $Al_2O_3$, ZnO, CuO, $Li_2O$, $Na_2O$, $K_2O$, MgO, CaO, BaO, $ZrO_2$, and $TiO_2$.

The glass forming the medium 15b preferably contains as the network modifier an oxide of the same metal as the metal powder particles 15a in the coating layer 15. Thus, the glass powder particles in the coating layer 15 are easily wet with the metal powder particles 15a in the coating layer 15.

The glass forming the medium 15b preferably contains $SiO_2$ as the highest content component. The amount of $SiO_2$ in the total amount of the glass is preferably about 35% by mole or more, for example. Non-limiting examples of the resin used as the medium 15b include thermosetting resins, such as epoxy resins and phenol resins.

In the coating layers 15, the metal powder particles 15a are dispersed in the medium 15b. The amount of the metal powder particles 15a in the coating layer 15 is preferably about 25% to about 65% by volume and more preferably about 50% to about 60% by volume, for example. For example, the metal powder particles 15a are made of a metal, such as Cu, Ni, Ag, Pd or Au, or an alloy containing one or more of these metals, such as Ag—Pd alloy. The metal powder particles 15a preferably do not contain as a major component the same metal as the metal contained as a major component in the first and second internal electrodes 11 and 12. In other words, the major component of the metal powder particles 15a is preferably different from that of the first and second internal electrodes 11 and 12. If the metal powder particles 15a contain the same metal as the metal contained as a major component in the first and second internal electrodes 11 and 12, the content of the metal is preferably about 10% or less of the total volume of the metal powder particles 15a. The metal powder particles 15a preferably have a core made of Cu, for example.

Figure 18:
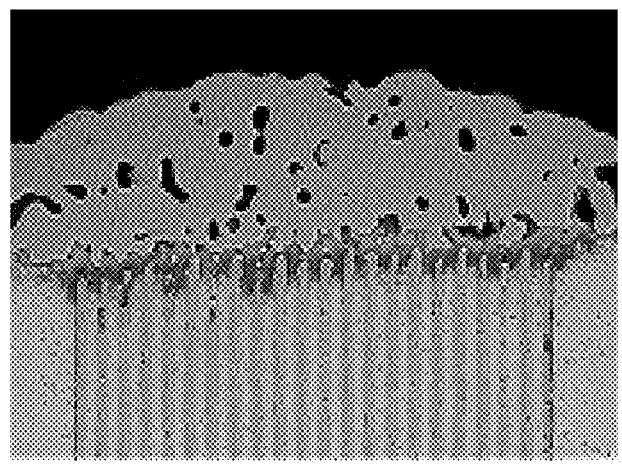
FIG. 18 is a photograph of a cross section of a sintered metal film obtained by firing an electrically conductive paste layer.

The coating layer 15 is different from a sintered metal film obtained by firing an electrically conductive paste layer and made of a sintered metal and a glass. Specifically, whereas the coating layer 15 includes the medium 15b continuously arranged to fill the spaces between the metal powder particles 15a, the sintered metal film preferably has a metal matrix formed therein. Whereas in the coating layer 15 all of the metal powder particles 15a are not sintered together and the medium 15b exists to join the spaces between the metal powder particles 15a, the glass in the sintered metal film, as shown in the photograph of FIG. 18, exists as a glass component extruded from the interior of the sintered metal film to the interface between the sintered metal film and the ceramic body by the sintering of the metal powder particles. Alternatively or additionally, although cannot be confirmed from FIG. 18, the glass may exist at the surface of the sintered metal film as the result of extrusion from the interior to the surface of the sintered metal film due to the sintering of the metal powder particles. In the sintered metal film obtained by firing the electrically conductive paste layer, substantially all of the metal powder particles are sintered and substantially no unsintered metal powder particles exist.

The metal powder particles 15a preferably have an elongated shape as viewed in cross section along the thickness direction of the coating layer 15. The metal powder particles 15a are preferably in flake form, such as scaly, flat or acicular form, as viewed in cross section along the thickness direction of the coating layer 15. The elongated shape herein indicates that the aspect ratio preferably is about 3 or more.

The aspect ratio of the metal powder particles 15a is preferably about 3.6 or more and more preferably about 7.4 to about 14.2 both inclusive.

Figure 8:
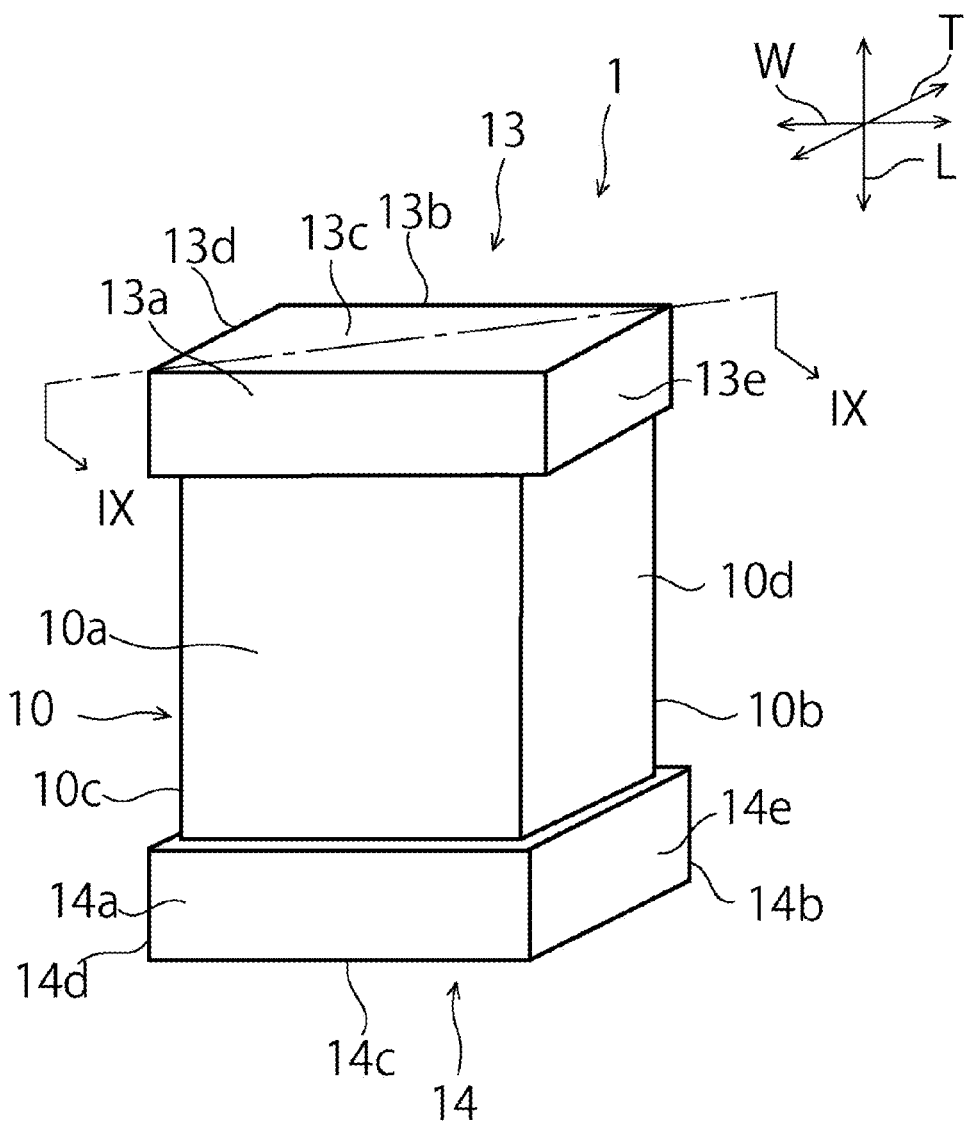
FIG. 8 is a schematic view for illustrating a method for determining the aspect ratio of metal powder particles according to a preferred embodiment of the present invention.
Figure 9:
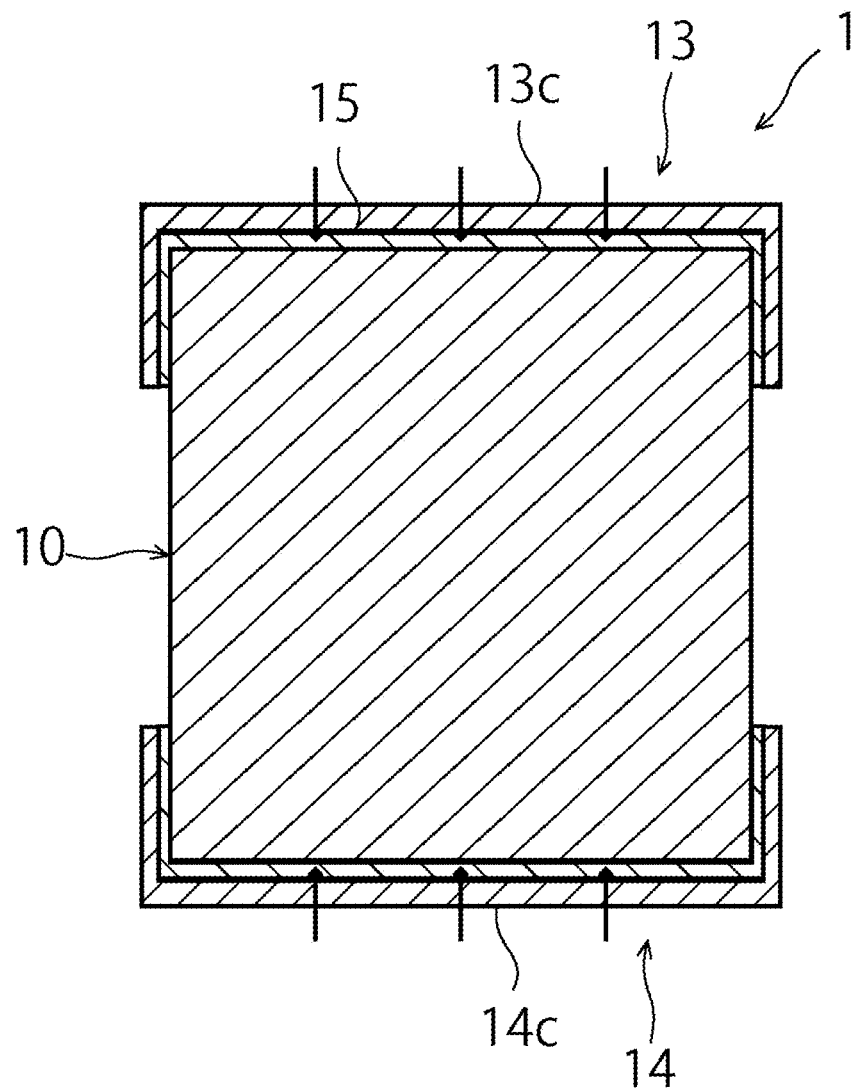
FIG. 9 is a schematic cross-sectional view taken along the line IX-IX in FIG. 8.

The "aspect ratio of the metal powder particles" herein is a value obtained through a determination in the following manner. First, the ceramic electronic component 1 is ground from one of the ridges toward the line IX-IX connecting a pair of opposing corners of a third portion 13c of the first electrode terminal 13 shown in FIG. 8 to expose a cross section of the coating layer 15 as shown in FIG. 9. Next, the resultant cross section is divided into four equal portions in the direction of the line IX-IX as shown in FIG. 9 and the coating layer 15 is observed at the three boundary sites between the adjacent portions using a SEM at a magnification of ×5000 and an accelerating voltage of 15 kV. Next, in the SEM observation at each of the three sites, all of the metal powder particles 15a within a field of 30 μm by 30 μm are measured in terms of diameter on the exposed cross section and the maximum of the measured values is selected as the long diameter. Next, in the metal powder particle 15a having the selected long diameter, the maximum of thicknesses along the axis perpendicular to the axis of the long diameter is selected as the short diameter. By dividing the long diameter by the short diameter, the aspect ratio of this metal powder particle 15a is calculated.

Likewise, as shown by the arrows in FIG. 9, the aspect ratios of metal powder particles 15a are calculated also in the coating layer 15 of a third portion 14c of the second electrode terminal 14. In this manner, a total of six aspect ratios of metal powder particles 15a are calculated in both the coating layers 15 of the first and second electrode terminals 13 and 14. The average value of these six aspect ratios is used as the aspect ratio of the metal powder particles 15a in various preferred embodiments of the present invention. Note that if in the SEM observations a plurality of metal powder particles 15a are contiguous with one another in the direction of their long diameters and thus can be observed as a single integral metal powder particle 15a, the long diameter of the entire integral unit of the plurality of metal powder particles 15a is regarded as the long diameter of a single metal powder particle 15a.

The metal powder particles 15a preferably have an average particle size of about 0.5 μm to about 10 μm, for example. The average particle size of the metal powder particles 15a in various preferred embodiments of the present invention refers to an average value of the long and short diameters of the six metal powder particles measured in the above manner, that is, a value obtaining by adding up all the measured long and short diameters of the six metal powder particles and dividing the total by 12.

The metal powder particles define conduction paths electrically connecting the first and second internal electrodes 11 and 12 with the first and second electrode terminals 13 and 14, respectively. At least one of the conduction paths is arranged so that a plurality of the metal powder particles are contiguous with one another across the thickness of the coating layer 15. However, some of the conduction paths may be defined by a single metal powder particle.

The conduction path may be non-linear as viewed in cross section along the thickness direction of the coating layer 15. The conduction path may include a plurality of relatively narrow portions and a plurality of relatively thick portions.

The long diameter of the metal powder particles forming the conduction paths preferably is preferably equal to or larger than the thickness of the coating layer 15. The long diameter of the metal powder particles forming the conduction paths is preferably about 1.5 or more times the thickness of the coating layer 15, for example.

The coating layer 15 preferably has a thickness of about 1 μm to about 10 μm, for example. If the thickness of the coating layer 15 is less than about 1 μm, this may reduce the effect of improving the moisture resistance of the ceramic electronic component 1 owing to the existence of the coating layer 15. If the thickness of the coating layer 15 is more than about 10 μm, the absolute amount of glass contained in the coating layer 15 becomes large. Thus, the components forming the first and second internal electrodes 11 and 12 are likely to diffuse in liquid phase in molten glass of the coating layer 15. In this case, the distal ends of the first and second internal electrodes 11 and 12 will be thin, so that gaps may be created between the first and second internal electrodes 11 and 12 and the adjacent ceramic layers 10g to decrease the moisture resistance of the ceramic electronic component 1.

The thickness of the coating layer 15 can be measured by grinding the side surface of the ceramic electronic component 1 to a midportion of the ceramic electronic component 1 along the length direction L to form a cross section and observing the thickness of the coating layer 15 located in the middle of the end surface of one of the electrode terminals in the formed cross section using an optical microscope.

The first and second internal electrodes 11 and 12 may partly project from the surface of the ceramic body 10 to enter the coating layers 15 but preferably should not pass through the coating layers 15.

The first electrode terminal 13 is provided directly on the associated coating layer 15. The first electrode terminal 13 is electrically connected to the first internal electrodes 11 via the conduction paths formed in the coating layer 15. The first electrode terminal 13 preferably includes a first portion 13a located on the first principal surface 10a; a second portion 13b located on the second principal surface 10b; a third portion 13c located on the first end surface 10e; a fourth portion 13d located on the first side surface 10c; and a fifth portion 13e located on the second side surface 10d.

The second electrode terminal 14 is provided directly on the associated coating layer 15. The second electrode terminal 14 is electrically connected to the second internal electrodes 12 via the conduction paths located in the coating layer 15. The second electrode terminal 14 preferably includes a first portion 14a located on the first principal surface 10a; a second portion 14b located on the second principal surface 10b; a third portion 14c located on the second end surface 10f; a fourth portion 14d located on the first side surface 10c; and a fifth portion 14e located on the second side surface 10d.

The first and second electrode terminals 13 and 14 each preferably include a plating film. The plating film is preferably made of at least one metal selected from the group consisting of Cu, Ni, Sn, Pd, Au, Ag, Pt, Bi, and Zn or an alloy containing at least one of these metals. Each of the first and second electrode terminals 13 and 14 may preferably include a monolayer, bilayer or multilayer plating film. For example, the plating film may have a Ni—Sn bilayer structure or a Cu—Ni—Sn trilayer structure. In this preferred embodiment, as shown in FIG. 5, each of the first and second electrode terminals 13 and 14 preferably includes a first layer 13p made of Cu, a second layer 13q made of Ni, and a third layer 13r made of Sn, for example.

The total thickness of the coating layer 15 and the first electrode terminal 13 is preferably about 15 µm to about 25 µm, for example. Likewise, the total thickness of the coating layer 15 and the second electrode terminal 14 is preferably about 15 µm to about 25 µm, for example.

A description is next given of a non-limiting example of a method for producing the ceramic electronic component 1 according to a preferred embodiment of the present invention.

Figure 10:
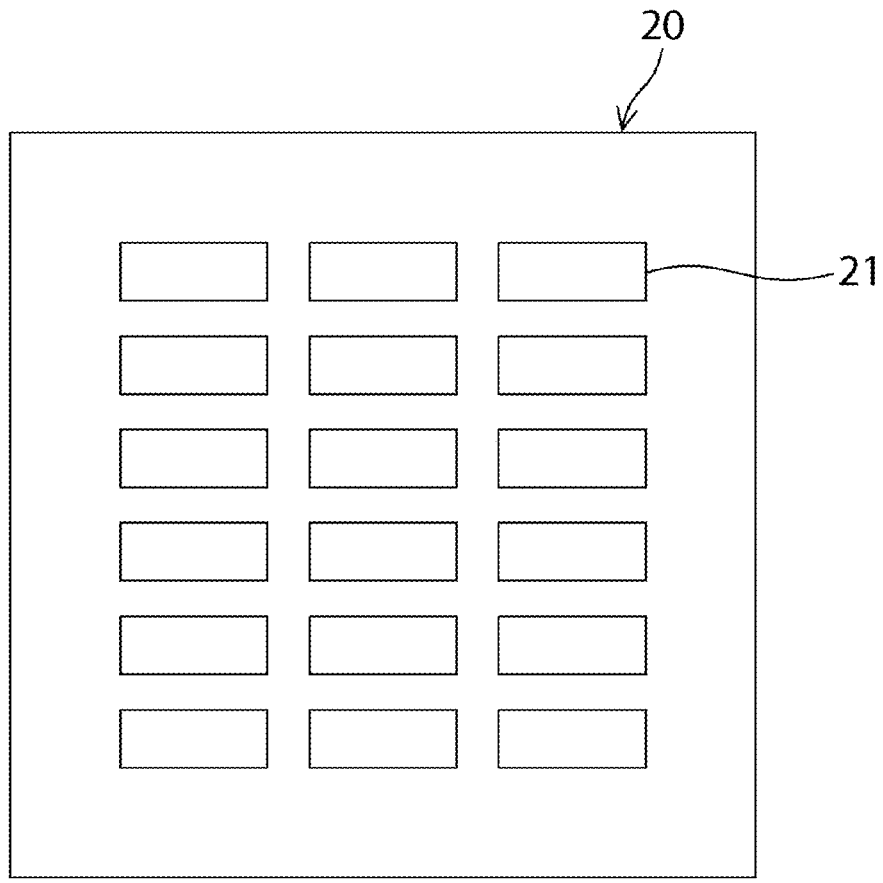
FIG. 10 is a schematic plan view of a ceramic green sheet having an electrical conduction pattern located thereon.

First, a ceramic green sheet 20 (see FIG. 10) is prepared which contains a ceramic material for forming a ceramic body 10. Next, as shown in FIG. 10, an electrically conductive paste is applied on the ceramic green sheet 20 to form an electrically conductive pattern 21. The application of the electrically conductive pattern can be performed by various printing processes, such as screen printing. The electrically conductive paste may contain, aside from electrically conductive particles, a known binder and a known solvent.

Next, a plurality of ceramic green sheets 20 with no electrically conductive pattern 21 formed thereon, a ceramic green sheet 20 with an electrically conductive pattern 21 formed in a configuration corresponding to the first or second internal electrodes 11, 12, and a plurality of ceramic green sheets 20 with no electrically conductive pattern 21 formed thereon are laminated in this order on the first-mentioned ceramic green sheet 20 and then pressed in the laminating direction to produce a mother laminate 22 shown in FIG. 10.

Next, the mother laminate is cut along imaginary cutting lines to produce a plurality of green ceramic laminates from the mother laminate.

The cutting of the mother laminate can be performed by dicing or press cutting. The ridges and corners of the green ceramic laminates may be rounded such as by barrel polishing.

Next, the green ceramic laminates are fired. In this firing step, the first and second internal electrodes 11 and 12 are fired. The firing temperature can be appropriately selected depending upon the types of the ceramic material and electrically conductive paste used. The firing temperature may be 900° C. to 1300° C., for example.

Next, a paste containing a glass or resin is applied on relevant regions of each of the fired ceramic laminates, such as by dipping. Next, the paste is thermally treated to melt the glass powder or resin into integral molten material and the molten material is cooled to form each medium 15b and bond the medium 15b and the metal powder particles 15a together, resulting in the formation of each coating layer 15. For example, if the coating layer 15 is a glass coating layer containing a glass, a glass paste used for the formation of the coating layer 15 contains glass powder particles, metal powder particles, a binder, a solvent, and so on. Here, the glass powder particles used are preferably those having a smaller particle size than the metal powder particles 15a. Preferably, the thermal treatment temperature is equal to or higher than the softening temperature of the glass powder particles and is such a temperature that does not cause the metal powder particles to sinter. For example, the thermal treatment temperature is preferably 600° C. to 750° C. If the thermal treatment temperature is lower than 600° C., the glass will not soften, so that the adhesion to the ceramic body 10 may be decreased. On the other hand, if the thermal treatment temperature is higher than 750° C., the reaction between the ceramic body 10 and the coating layers 15 may be initiated to cause the coating layers 15 to disappear.

If the coating layer 15 is formed of a resin coating layer, the thermal treatment temperature is preferably 100° C. to 400° C., for example. If the thermal treatment temperature is lower than 100° C., the resin may not harden. On the other hand, if the thermal treatment temperature is higher than 400° C., the resin may burn off.

Next, the coating layers 15 are plated to form first and second electrode terminals 13 and 14. In the above manner, a ceramic electronic component 1 can be produced.

An example of a sample ceramic electronic component 1 actually produced in this preferred embodiment is shown below.

Dimensions of ceramic body after firing (design values): 1.0 mm by 0.5 mm by 0.15 mm
Ceramic material: BaTiO3
Thickness of ceramic layer after firing (design values): 0.9 µm
Material of internal electrode: Ni
Thickness of internal electrode after firing (design values): 0.6 µm
Total number of internal electrodes: 45
Firing condition: keeping at 1200° C. for 2 hours
Capacity of ceramic electronic component: 0.47 µF
Rated voltage of ceramic electronic component: 4 V
Thickness of glass coating layer: 5 µm
Metal powder particles 15a contained in glass coating layer 15: Cu powder particles
Average particle size of Cu powder particles: 3 µm
Major component of glass powder particles in glass paste: borosilicate glass
Softening point of glass in glass paste: 600° C.
Average particle size of glass powder particles: 1 µm Ratio of Cu powder particles to glass powder particles in solid content of glass paste: 50% to 50% by volume
Condition of thermal treatment: 680° C.
Plating film: Cu film (6 μm thickness), Ni film (3 μm thickness), and Sn film (3 μm thickness) are formed in this order on glass coating layer 15.

Five types of samples of the ceramic electronic component 1 in which metal powder particles 15a in their respective coating layers 15 have different aspect ratios of 1, 3.6, 4.6, 7.4, and 14.2 were produced, two for each type. Specifically, for each type of sample, two types of Cu plating films were formed under their respective conditions of application of a current of 3 A for 90 minutes and application of a current of 5 A for 90 minutes to produce two samples. In both the cases, the coverage (%) of Cu plating film on the coating layer 15 was determined. The results are shown in TABLE 1.

TABLE 1

|  |  | Aspect Ratio of Metal Powder Particles | | | | |
| --- | --- | --- | --- | --- | --- | --- |
|  |  | 1 | 3.6 | 4.6 | 7.4 | 14.2 |
| Plating Condition (90 minutes) | Current value 3 A | 36.9% | 71.7% | 80.2% | 93.0% | 97.5% |
|  | Current value 5 A | 40.2% | 87.5% | 91.9% | 96.8% | 97.3% |

The coverage (%) of Cu plating film was determined in the following manner. A midportion of the first electrode terminal on the first principal surface of each sample was observed by SEM (2000-fold magnification, 15 kV accelerating voltage) to obtain a reflection electron image, the obtained image was binarized, and the amount (%) of the area of Cu plating film with respect to 100% of a field of 50 μm by 50 μm of the image was determined. The average value of the area amounts of Cu plating film in five samples was used as the coverage (%). In the above table, the aspect ratio of metal powder particles 15a was determined by the previously-described determination method.

Figure 11:
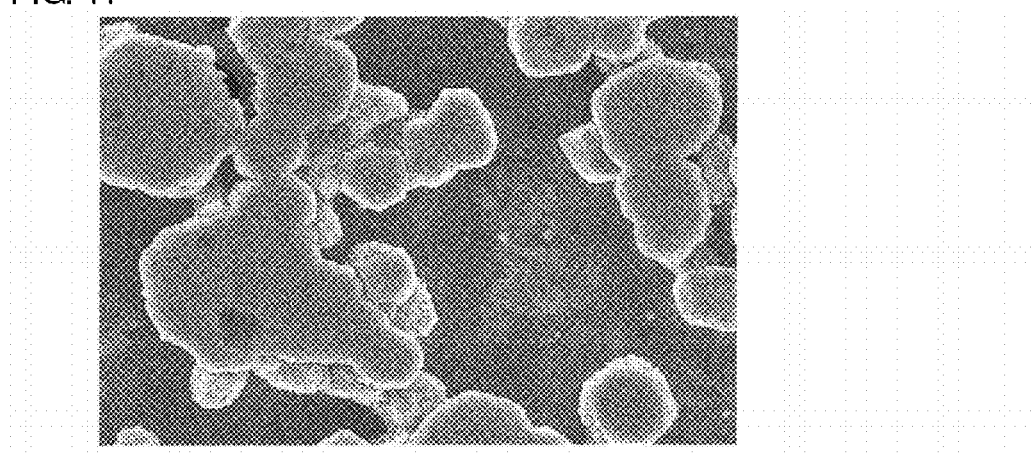
FIG. 11 is a photograph of the surface of a Cu plating film as observed by SEM when the Cu plating film was formed at an aspect ratio of metal powder particles of about 1 and at a current of about 5 A in a production process of the ceramic electronic component according to a preferred embodiment of the present invention.
Figure 12:
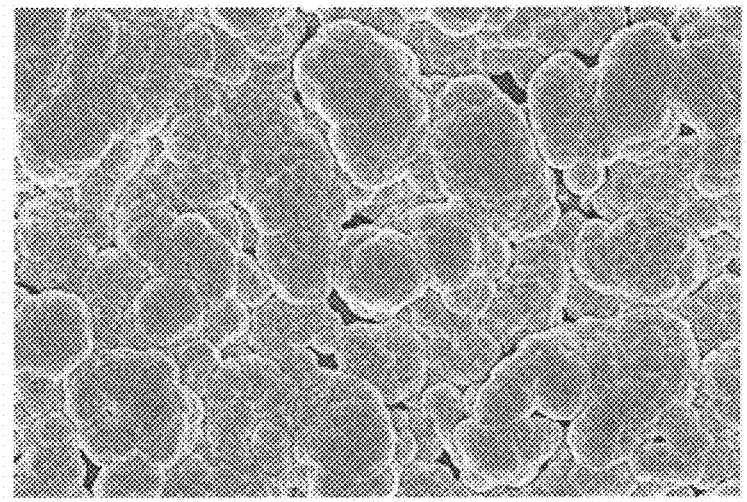
FIG. 12 is a photograph of the surface of a Cu plating film as observed by SEM when the Cu plating film was formed at an aspect ratio of metal powder particles of about 3.6 and at a current of about 5 A in a production process of the ceramic electronic component according to a preferred embodiment of the present invention.
Figure 13:
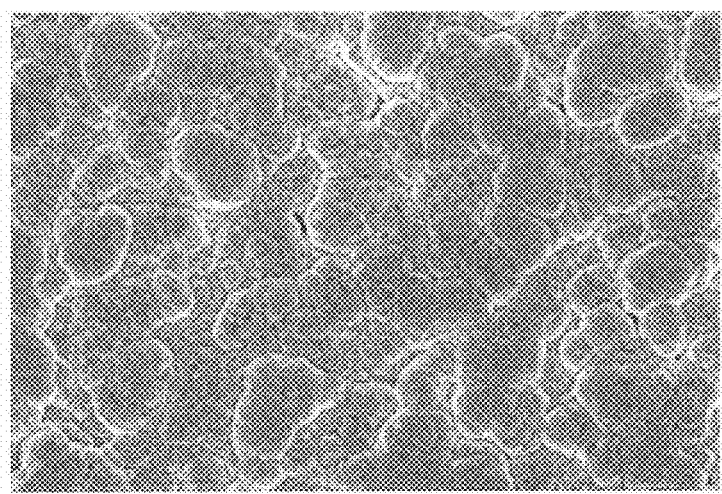
FIG. 13 is a photograph of the surface of a Cu plating film as observed by SEM when the Cu plating film was formed at an aspect ratio of metal powder particles of about 7.4 and at a current of about 5 A in a production process of the ceramic electronic component according to a preferred embodiment of the present invention.

FIG. 11 is a photograph of the surface of a Cu plating film as observed by SEM when the Cu plating film was formed under the conditions of an aspect ratio of metal powder particles 15a of about 1 and a current of about 5 A. FIG. 12 is a photograph of the surface of a Cu plating film as observed by SEM when the Cu plating film was formed under the conditions of an aspect ratio of metal powder particles 15a of about 3.6 and a current of about 5 A. FIG. 13 is a photograph of the surface of a Cu plating film as observed by SEM when the Cu plating film was formed under the conditions of an aspect ratio of metal powder particles 15a of about 7.4 and a current of about 5 A.

As described previously, in this preferred embodiment, the metal powder particles preferably have an elongated shape as viewed in cross section along the thickness direction of the coating layer 15. Therefore, the area of the metal powder particles exposed on the surface of the coating layer 15 is large. Thus, the coverage of the plating films on the surfaces of the coating layers 15 becomes large to increase the adhesion strength between the coating layers 15 and the associated plating films (i.e., the first and second electrode terminals 13 and 14). Hence, the plating films can be coated in a short period of time even at a small current to increase the efficiency of the plating process and the growth of the plating films in the thickness direction can be suppressed to achieve size reduction of the electronic component.

In addition, when the aspect ratio of the metal powder particles is about 3.6 or more, the above advantageous effects can be significantly achieved.

Hereinafter, other preferred embodiments of the present invention will be described. In the following description of preferred embodiments, elements having functions substantially common to those of elements in the first preferred embodiment are referred to by common reference numerals, and further explanation thereof will be accordingly omitted.

Second Preferred Embodiment

Figure 14:
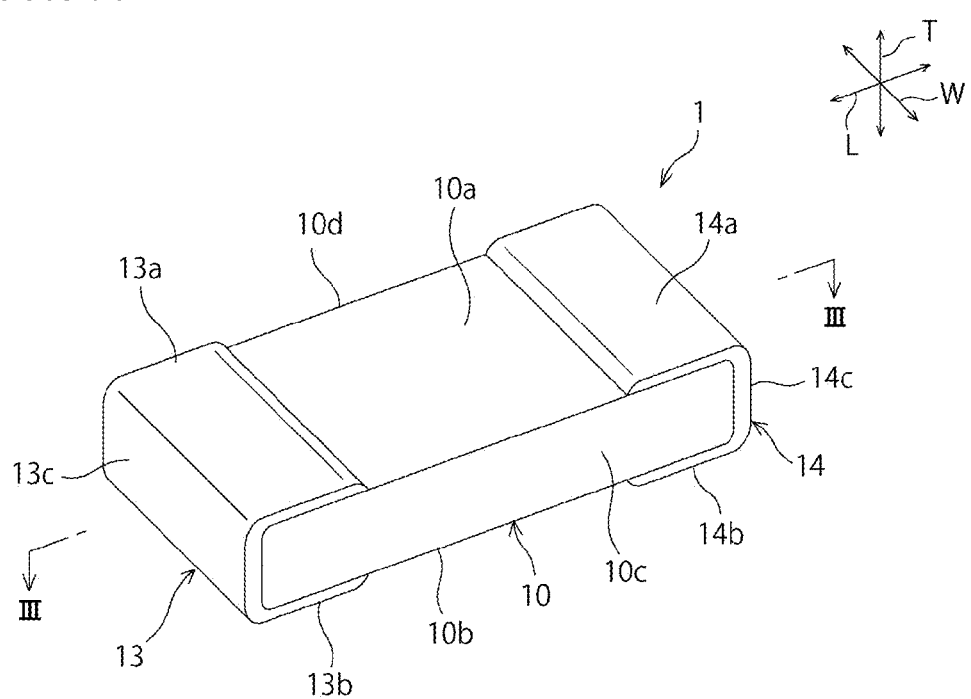
FIG. 14 is a schematic perspective view of a ceramic electronic component according to a second preferred embodiment of the present invention.

FIG. 14 is a schematic perspective view of a ceramic electronic component according to a second preferred embodiment of the present invention.

In the above first preferred embodiment, an example has been described in which the first and second electrode terminals 13 and 14 and the coating layers 15 are located on the first and second side surfaces 10c and 10d. However, as shown in FIG. 14, the first and second electrode terminals 13 and 14 and the coating layers 15 may not be substantially located on the first and second side surfaces 10c and 10d.

Figure 15:
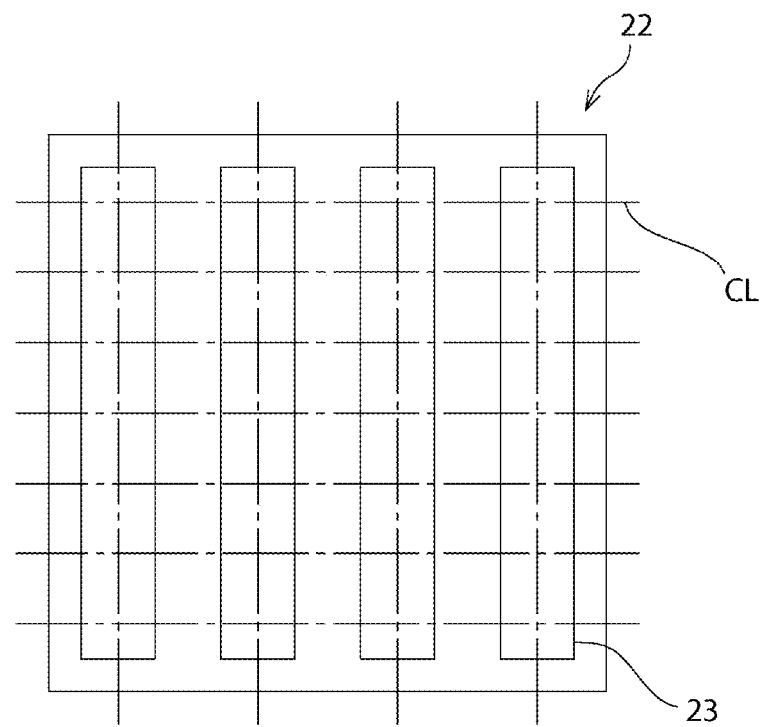
FIG. 15 is a schematic plan view of a mother laminate.

The ceramic electronic component according to the second preferred embodiment can be produced, for example, in the following manner. A mother laminate 22 (see FIG. 15) is obtained in the same manner as in the method for producing the ceramic electronic component 1 according to the first preferred embodiment. In this preferred embodiment, next, as shown in FIG. 15, an electrically conductive pattern 23 having a configuration corresponding to the first and second portions 13a, 13b, 14a, and 14b of the first and second electrode terminals 13 and 14 is formed on the mother laminate 22 by an appropriate printing process, such as screen printing. Next, the mother laminate 22 is cut along imaginary cutting lines CL to produce a plurality of green ceramic laminates from the mother laminate 22.

Next, each of the green ceramic laminates is fired. Next, a paste is applied on both end surfaces of the fired ceramic laminate. Next, the paste is thermally treated to form coating layers 15 having shapes corresponding to the third portions 13c and 14c of the first and second electrode terminals 13 and 14. Next, the coating layers 15 are plated to form the first and second electrode terminals 13 and 14. Thus, the ceramic electronic component according to the second preferred embodiment can be produced.

The glass paste applied to the third portions 13c and 14c of the first and second electrode terminals 13 and 14 is different in type of metal or type of inorganic filler from the electrically conductive pattern 23 formed on the first and second portions 13a, 13b, 14a, and 14b of the first and second electrode terminals 13 and 14. For example, the electrically conductive pattern 23 preferably contains Ni and a common ceramic material to the ceramic material contained in the ceramic body 10.

Third Preferred Embodiment

Figure 16:
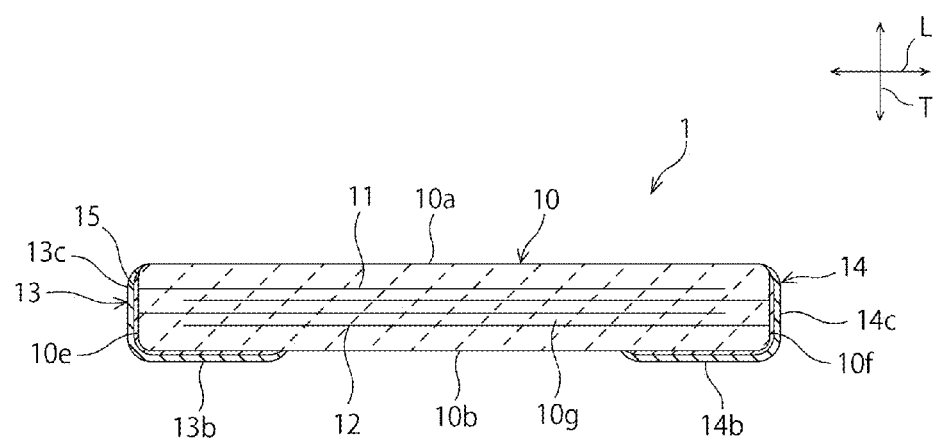
FIG. 16 is a schematic cross-sectional view of a ceramic electronic component according to a third preferred embodiment of the present invention.

FIG. 16 is a schematic cross-sectional view of a ceramic electronic component according to a third preferred embodiment of the present invention.

In the above first preferred embodiment, an example has been described in which the first and second electrode terminals 13 and 14 and the coating layers 15 are located on both the first and second principal surfaces 10a and 10b. However, the present invention is not limited to this configuration. The first and second electrode terminals 13 and 14 and the coating layers 15 only have to be located somewhere on the surface of the ceramic body 10.

For example, as shown in FIG. 16, the first and second electrode terminals 13 and 14 and the coating layers 15 may be located on the second principal surface 10b but not located on the first principal surface 10a.

Fourth Preferred Embodiment

Figure 17:
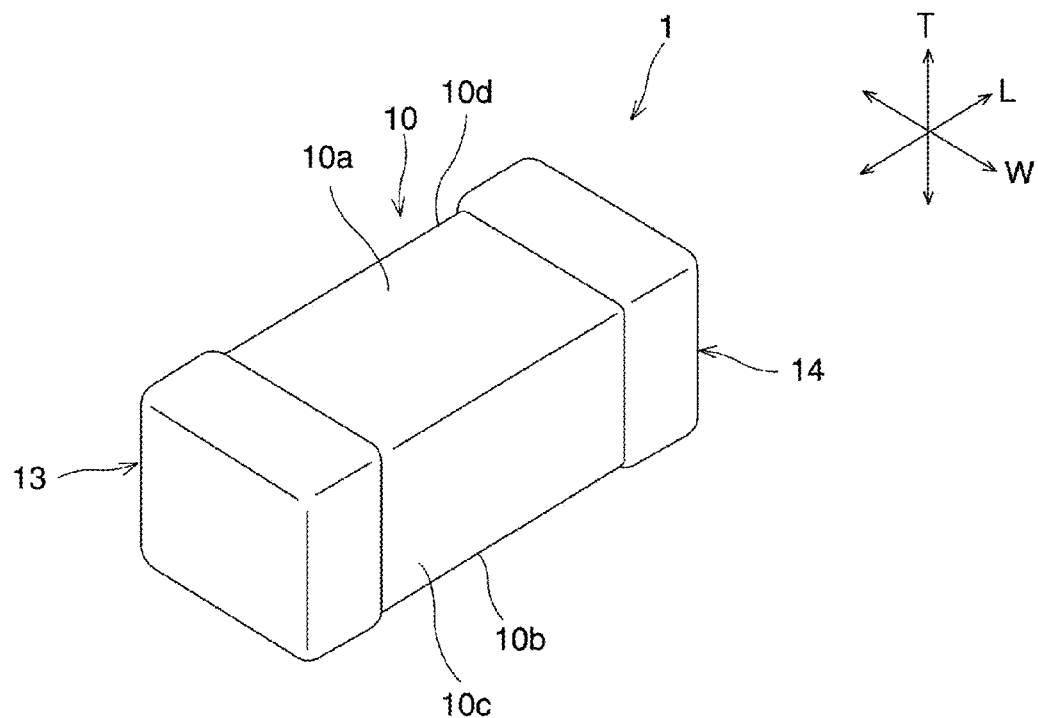
FIG. 17 is a schematic perspective view of a ceramic electronic component according to a fourth preferred embodiment of the present invention.

FIG. 17 is a schematic perspective view of a ceramic electronic component according to a fourth preferred embodiment of the present invention.

In the above first preferred embodiment, an example has been described in which the inequality $D_T<D_W<D_L$ holds where the thickness of the ceramic body 10 is represented by $D_T$, the length thereof is represented by $D_L$, and the width thereof is represented by $D_W$. However, as shown in FIG. 17, the ceramic body 30 may satisfy $D_W \leq D_T<D_L$.

As described so far, in various preferred embodiments of the present invention, the portions of the ceramic body from which the internal electrodes are exposed are covered by the coating layers. Therefore, a ceramic electronic component having superior moisture resistance can be provided.

Hence, with the structure in which the coating layers cover the portions of the ceramic body from which the internal electrodes are exposed, preferred embodiments of the present invention can be widely applied to various laminated ceramic electronic components.

For example, if the ceramic electronic component 1 is a piezo-ceramic element, the ceramic body 10 can be made of a piezo-ceramic material. Specific non-limiting examples of the piezo-ceramic material include lead zirconate titanate (PZT) based ceramic materials.

Alternatively, if the ceramic electronic component 1 is a thermistor, the ceramic body 10 can be made of a semiconductor ceramic material. Specific non-limiting examples of the semiconductor ceramic material include spinel ceramic materials.

Still alternatively, if the ceramic electronic component 1 is an inductor, the ceramic body 10 can be made of a magnetic ceramic material. Specific non-limiting examples of the magnetic ceramic material include ferrite ceramic materials.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
a ceramic body;
a plurality of internal electrodes provided in the ceramic body and including ends exposed on a surface of the ceramic body;
at least one coating layer covering a portion of the surface of the ceramic body on which the plurality of internal electrodes are exposed, the at least one coating layer being made of a glass medium in which metal powder particles are dispersed; and
at least one electrode terminal provided directly on the at least one coating layer and including a plating film; wherein
the at least one coating layer is a composite film in which the glass medium and the metal powder particles are integrally bonded;
the at least one coating layer has a thickness of about 1 to 10 µm;
the metal powder particles define conduction paths electrically connecting the plurality of internal electrodes with the at least one electrode terminal;
the metal powder particles have an elongated shape as viewed in cross section along a direction of thickness of the at least one coating layer;
the metal powder particles defining the conduction paths have a maximum diameter equal to or larger than the thickness of the at least one coating layer; and
all of the metal powder particles are not sintered together and the glass medium continuously exists to join the spaces between the metal powder particles.

2. The ceramic electronic component according to claim 1, wherein the metal powder particles are in flake form.

3. The ceramic electronic component according to claim 1, wherein the maximum diameter of the metal powder particles is about 1.5 or more times the thickness of the at least one coating layer.

4. The ceramic electronic component according to claim 1, wherein the metal powder particles have an aspect ratio of about 3.6 or more.

5. The ceramic electronic component according to claim 1, wherein at least one of the conduction paths is arranged so that a plurality of the metal powder particles are contiguous with one another across the thickness of the at least one coating layer.

6. The ceramic electronic component according to claim 1, wherein the metal powder particles contain a major component different from a metal contained as a major component in the internal electrodes.

7. The ceramic electronic component according to claim 1, wherein the metal powder particles include a core made of Cu.

8. The ceramic electronic component according to claim 1, wherein at least one of the conduction paths is non-linear as viewed in cross section along the direction of the thickness of the at least one coating layer.

9. The ceramic electronic component according to claim 1, wherein at least one of the conduction paths includes a plurality of relatively narrow portions and a plurality of relatively thick portions.

10. The ceramic electronic component according to claim 1, wherein a portion of the plating film in contact with the at least one coating layer is defined by a Cu plating film or a Ni plating film.

11. The ceramic electronic component according to claim 1, wherein an amount of glass in the at least one coating layer is about 35% by volume or more.

12. The ceramic electronic component according to claim 1, wherein the at least one electrode terminal includes two electrode terminals located on first and second side surfaces of the ceramic body, respectively.

13. The ceramic electronic component according to claim 1, wherein the at least one electrode terminal includes two electrode terminals that are not located on first and second side surfaces of the ceramic body.

14. The ceramic electronic component according to claim 1, wherein the ceramic body includes first and second principal surfaces and the at least one electrode terminal includes two electrode terminals located on the second principal surface but not on the first principal surface of the ceramic body.

15. The ceramic electronic component according to claim 1, wherein ceramic body has a thickness DT, a length DL, and a width DW, which satisfy DT<DW<DL, (1/5)DW≤DN≤(1/2) DW or DT<0.3 mm.

16. The ceramic electronic component according to claim 15, wherein the ceramic body satisfies $0.05 \text{ mm} \leq DT < 0.3 \text{ mm}$, $0.4 \text{ mm} \leq DL \leq 1 \text{ mm}$, and $0.3 \text{ mm} \leq DW \leq 0.5 \text{ mm}$.

17. The ceramic electronic component according to claim 1, wherein ceramic body has a thickness DT, a length DL, and a width DW, which satisfy $DW < DT < DL$.

18. The ceramic electronic component according to claim 1, wherein the at least one coating layer includes a plurality of coating layers arranged to cover portions of the ceramic body at which the internal electrodes are exposed.

19. The ceramic electronic component according to claim 18, wherein the plurality of coating layers are provided on first and second end surfaces of the ceramic body, both ends of each of first and second principal surfaces in a length direction of the ceramic body, and both ends of each of first and second side surfaces of the ceramic body in the length direction.

\* \* \* \* \*